United States Patent
Sherrima et al.

(10) Patent No.: US 10,446,488 B1
(45) Date of Patent: Oct. 15, 2019

(54) VERTICALLY-CONNECTED PACKAGELESS FUSE DEVICE

(71) Applicant: Manufacturing Networks Incorporated (MNI), Santa Clara, CA (US)

(72) Inventors: Faraj Sherrima, Santa Clara, CA (US); Vallangiman Venkataraman Srinivasan, San Francisco, CA (US)

(73) Assignee: Manufacturing Networks Incorporated (MNI), Santa Clara, CA (US)

( * ) Notice: Subject to any disclaimer, the term of this patent is extended or adjusted under 35 U.S.C. 154(b) by 0 days.

(21) Appl. No.: 16/283,806

(22) Filed: Feb. 24, 2019

(51) Int. Cl.
  *H01L 23/525* (2006.01)
  *H01L 23/538* (2006.01)
  *H01L 23/532* (2006.01)
  *H05K 3/40* (2006.01)

(52) U.S. Cl.
  CPC ...... *H01L 23/5256* (2013.01); *H01L 23/5382* (2013.01); *H01L 23/53204* (2013.01); *H05K 3/4038* (2013.01)

(58) Field of Classification Search
  CPC ............. H01L 23/5256; H01L 23/5382; H01L 23/53204; H05K 3/4038
  See application file for complete search history.

(56) References Cited

U.S. PATENT DOCUMENTS

| | | | | |
|---|---|---|---|---|
| 3,354,282 A * | 11/1967 | Batsch | ................. | H01H 37/761 337/234 |
| 5,097,247 A * | 3/1992 | Doerrwaechter | .... | H01H 85/046 29/623 |
| 5,923,239 A * | 7/1999 | Krueger | ............... | H01H 69/022 337/152 |
| 6,198,376 B1 * | 3/2001 | Ishikawa | ............... | H01H 37/761 337/159 |
| 6,201,679 B1 * | 3/2001 | Richiuso | ................. | H01L 23/62 337/297 |
| 2005/0140491 A1 * | 6/2005 | Uehara | ................ | H01H 37/761 337/401 |
| 2006/0197647 A1 * | 9/2006 | Whitney | ............ | H01H 85/0418 337/297 |

* cited by examiner

*Primary Examiner* — Syed I Gheyas
(74) *Attorney, Agent, or Firm* — Invent Capture, LLC; Samuel S. Cho

(57) ABSTRACT

A novel fuse device incorporates electrically-conductive metal-filled vias that vertically connect frontside metal pads with backside metal pads through an electrically-insulated base substrate. The vias are initially created by drilling through the base substrate and then completed by filling the drilled vias with an electrically highly-conductive metallic substance. The vertical electrical connection between the frontside metal pads and the backside metal pads, established by the vias in the fuse structure, enables packageless integration of the novel fuse device to an electronic circuit by eliminating the structural need for wire bond pads and conventional leadframe or cavity packages. Preferably, each frontside metal pad of the novel fuse device is connected to an electrical terminal of the electronic circuit requiring fuse-based power protection, and each backside metal pad is attached to a printed circuit board (PCB) containing the electronic circuit for seamless direct mounting of the fuse structure.

15 Claims, 4 Drawing Sheets

300

400

500

600

700

VERTICALLY-CONNECTED PACKAGELESS FUSE DEVICE

BACKGROUND OF THE INVENTION

The present invention generally relates to power protection fuses for electronic circuits and electrical devices. More specifically, the invention relates to one or more embodiments of vertically-connected and temperature-triggered fuse devices that do not require conventional fuse packaging. Furthermore, the invention also relates to one or more embodiments of manufacturing such vertically-connected packageless fuse devices.

Modern electrical devices typically incorporate power-protection fuses to prevent an unexpected and/or undesirable power surge from damaging various components associated with such electrical devices. Many electrical devices operate in environments susceptible to unwanted and dangerous power surges or accidental reverse polarity input connections. If power surges (e.g. a voltage surge, a current surge, or both) are sufficiently high or prolonged beyond a negligible duration, electrical devices subject to power surges can sustain operation failure or permanent damages.

Therefore, protection against power surges have been commonly addressed by conventional power-protection fuses. Some fuses are one-time devices that may need to be replaced when activated, while other fuses are resettable. Regardless of one-time use or resettable characteristics, a conventional power-protection fuse is configured to monitor an operating current and/or an operating voltage of an electrical circuit connected to the conventional power-protection fuse, and is subsequently activated (i.e. blows the fuse to disconnect at least a portion of the electrical circuit, or clamps the operating voltage or current to a lower magnitude), when the operating current and/or the operating voltage exceeds or surges above a defined safe-operation threshold value. Typically, current or voltage surge above the defined safe-operation threshold value may damage, endanger, and/or overheat the electrical circuit connected to the fuse, unless the fuse is activated to disconnect the electrical circuit or to lower the operating voltage or current to a lower magnitude.

Conventional fuses that are often incorporated in integrated circuits (IC's) for power protection include transient voltage suppression (TVS) circuits, which protect IC's from accidental or undesirable high voltage spikes in the IC's. Examples of TVS circuits include electrostatic discharge (ESD) protection diodes. Conventional TVS protection circuits comprise two or more diodes, at least one of which is designed to conduct electricity temporarily in case of a high-voltage surge event. TVS circuits are typically designed to clamp the voltage to a particular voltage value during a power surge event, and are also designed to endure an accompanying current surge through the TVC circuits, thereby protecting the load which comprises integrated circuitry requiring protection from power surges.

However, some dangerous electrical device failures that result in gradual or sudden overheating of an electrical device, which may cause a deadly meltdown or explosion of the electrical device itself, cannot always be properly detected by merely monitoring the device operating voltage or current. For example, a mobile device with a malfunctioning battery or a malfunctioning charger may still exhibit a normal range of operating voltage and current levels, even as the temperature of the malfunctioning battery undergoes a thermal runaway to the point of the device meltdown or explosion. Conventional power-protection fuses that are designed to be triggered based on device voltage and/or current threshold levels alone are thus sometimes inaccurate or inappropriate for safeguarding against certain types of device malfunctions, such as device thermal runaway meltdowns or explosions.

Furthermore, a conventional power-protection fuse is typically encapsulated in a dedicated leadframe package or a cavity package, which takes up an extra space for device integration and also drives up the cost of manufacturing a fuse. In certain types of miniaturized power fuse integration needs, where a minimal fuse footprint and a minimal fuse space occupation in an electronic device is highly desired, conventional power protection fuses encapsulated in conventional bulky fuse packages hamper miniaturizations of power protection circuitry desired by circuit designers.

Moreover, packaging requirements for a conventionally-packaged power-protection fuse typically incur undesirable parasitic resistance caused by wire bonding and/or multiple intermediary elements for connecting electrical circuits to the external and the internal components of the conventionally-packaged power-protection fuse. This undesirable parasitic resistance causes unnecessary power loss through the fuse in a quiescent stage. However, the undesirable parasitic resistance and the related power loss is difficult to reduce in a conventional power-protection fuse, because the fuse packaging components are often inherent and essential for correct electrical connections and operational functionality of the conventional fuse.

Therefore, it may be advantageous to devise a novel electronic component structure as a novel fuse device, which enables small-footprint and packageless connections between the novel fuse device and an electronic device that requires power protection. Furthermore, it may also be advantageous to devise the novel fuse device to avoid the conventional fuse packaging for scalable and cost-effective miniaturization of the novel fuse device incorporated in an electronic device.

Moreover, it may also be advantageous to devise the novel fuse device to reduce or eliminate parasitic resistance inherent in conventional package elements associated with a conventional fuse device. In addition, it may also be advantageous to devise one or more novel device fabrication steps and methods for manufacturing the novel fuse device.

SUMMARY

Summary and Abstract summarize some aspects of the present invention. Simplifications or omissions may have been made to avoid obscuring the purpose of the Summary or the Abstract. These simplifications or omissions are not intended to limit the scope of the present invention.

In one embodiment of the invention, a vertically-connected packageless fuse device for protection against power surges and thermal runaways in an electronic circuit is disclosed. This novel packageless fuse device comprises: an electrically-insulating base substrate; a first via and a second via vertically drilled into the electrically-insulating base substrate, wherein the first via and the second via are subsequently filled with an electrically-conductive substance; a first frontside metal pad located on top of the first via and at least a portion of the electrically-insulating base substrate; a second frontside metal pad located on top of the second via and at least a portion of the electrically-insulating base substrate; an electrically-insulating gap positioned between the first frontside metal pad and the second frontside metal pad; a solder bridge mounted over the electrically-insulating gap, wherein the solder bridge is attached to the first frontside metal pad and the second frontside metal pad to conduct electricity unless the solder bridge is broken at a prespecified fuse activation condition; a first backside metal pad located below the first via and at least a portion of the electrically-insulating base substrate, wherein the first backside metal pad is configured to directly and packagelessly mount onto a printed circuit board (PCB) containing an electronic circuit requiring power surge protection without encapsulation in a leadframe or cavity package, and wherein the first backside metal pad and the first frontside metal pad are vertically and electrically connected by the first via; and a second backside metal pad located below the second via and at least a portion of the electrically-insulating base substrate, wherein the second backside metal pad does not contact the first backside metal pad, and is configured to directly and packagelessly mount onto the PCB containing the electronic circuit requiring power surge protection without encapsulation in the leadframe or cavity package, and wherein the second backside metal pad and the second frontside metal pad are vertically and electrically connected by the second via.

In another embodiment of the invention, a method for producing a vertically-connected packageless fuse device is disclosed. This method comprises the steps of: drilling vertically to create a first via and a second via through a base substrate; filling each of the first via and the second via with an electrically-conductive substance; depositing a first frontside metal pad and a second frontside metal pad on top of the base substrate; patterning the first frontside metal pad and the second frontside metal pad with etching or screening to create an electrically-insulating gap between the first frontside metal pad and the second frontside metal pad, and to optimize geometry of the first frontside metal pad and the second frontside metal pad for packageless and space-saving soldering configurations with electronic device circuit terminals requiring fuse-based power surge protection; constructing and mounting a solder bridge on top of the first frontside metal pad and the second frontside metal pad across the electrically-insulating gap; depositing a first backside metal pad and a second backside metal pad underneath the base substrate; and patterning the first backside metal pad and the second backside metal pad with etching or screening to create a separation between the first backside metal pad and the second backside metal pad, and to optimize geometry of the first backside metal pad and the second backside metal pad for packageless and space-saving attachment to a printed circuit board (PCB) containing the electronic device circuit terminals requiring fuse-based power surge protection.

DETAILED DESCRIPTION

Figure 1:
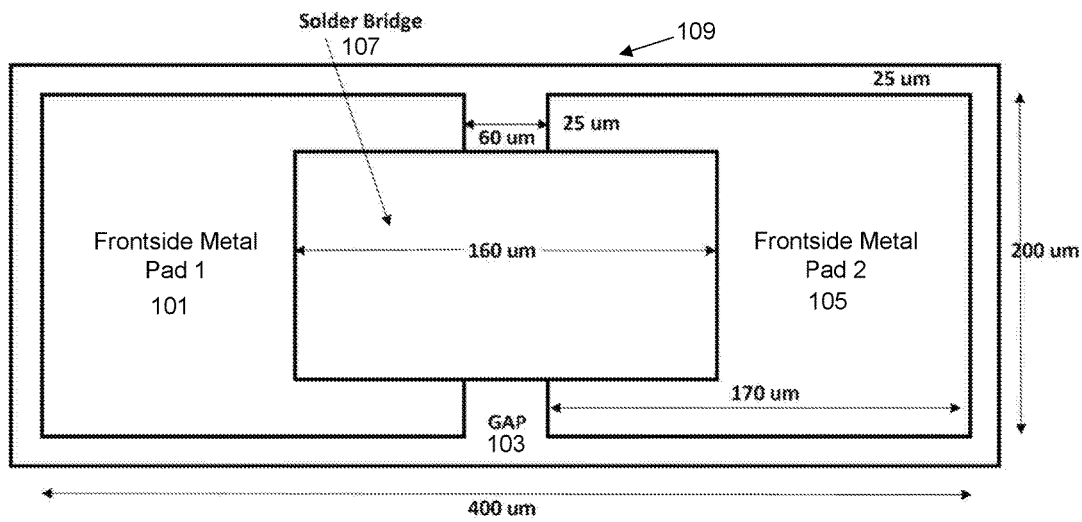
FIG. 1 shows a top view of a vertically-connected packageless fuse device after the device is constructed, in accordance with an embodiment of the invention.

Specific embodiments of the invention will now be described in detail with reference to the accompanying figures. Like elements in the various figures are denoted by like reference numerals for consistency.

In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

The detailed description is presented largely in terms of description of shapes, configurations, and/or other symbolic representations that directly or indirectly resemble a novel chip structure and/or a manufacturing method for a vertically-connected packageless fuse device. These descriptions and representations are the means used by those experienced or skilled in the art to most effectively convey the substance of their work to others skilled in the art.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment. Furthermore, separate or alternative embodiments are not necessarily mutually exclusive of other embodiments. Moreover, the order of blocks in process flowcharts or diagrams representing one or more embodiments of the invention do not inherently indicate any particular order nor imply any limitations in the invention.

For the purpose of describing the invention, a term described herein as a "fuse" or a "fuse device" is defined as a special-purpose apparatus, which is designed to protect a circuit or another electronic component from malfunctions or damages due to undesirable power surges and/or thermal runaways. A fuse may be an integrated electronic component to an integrated circuit (IC's) or a discrete component operatively connected to IC's or other electronic components.

Furthermore, for the purpose of describing the invention, a term described herein as a "packageless fuse device" is defined as a uniquely-structured fuse device that does not require conventional encapsulations of the fuse component structure by a leadframe package, a cavity package, or another device package configuration commonly utilized in chip and/or electronic device manufacturing. In a preferred embodiment of the invention, a packageless fuse device is mounted directly to a printed circuit board (PCB) that integrates a circuitry requiring power protection, without external leadframe or cavity packaging for the fuse. The direct "packageless" PCB mounting is achieved by utilizing two frontside metal pads of the packageless fuse device to connect to two terminals of the circuitry that require fuse-based power protection, and also by utilizing two backside metal pads of the packageless fuse device to provide both electrical connection and physical mounting onto the PCB. In the preferred embodiment, the fuse structure (e.g. with a solder bridge across a gap, etc.) is constructed on an electrically-insulating base substrate, with metal-filled vias that provide vertical electrical connection pathways between the frontside metal pads and the backside metal pads through the electrically-insulating base substrate, as illustrated, for example, in FIGS. 4 and 7.

In addition, for the purpose of describing the invention, a term described herein as "vertically-connected" is defined as a vertically-oriented electrical connection provided by one or more electrically-conductive "vias" between a frontside pad and a backside pad on a fuse, which is typically constructed on an electrically-insulating base substrate. In a preferred embodiment of the invention, each via is vertically drilled into the base substrate and then filled with electrically-conductive materials to provide a vertical electrical connection pathway between the frontside pad and the backside pad. Typically, each via is filled with copper, PdAg, or another metallic substance for low-resistance electrical conductivity between the frontside pad and the backside pad in the fuse structure.

Moreover, for the purpose of describing the invention, a term described herein as "wetting force" is defined as a net pulling or pushing force resulting from intermolecular interactions among one or more wetting materials and a solder bridge or a solder ball at varying temperatures. In a preferred embodiment of the invention, as ambient temperature increases to a threshold temperature for activating a temperature-triggered fuse, the wetting force generated by intermolecular tensions among wetting material(s) (e.g. nickel gold (Ni/Au), copper gold (Cu/Au)) on a non-metallic substrate and a solder bridge or a solder ball, which connects a pair of wetting materials separated by an air gap, becomes sufficiently strong enough to break off the solder bridge or the solder ball.

Furthermore, for the purpose of describing the invention, a term described herein as a "solder bridge" or a "solder ball" is defined as a temperature-specific, current-specific, and/or voltage-specific breakable electrical connection element between a first frontside metal pad and a second frontside metal pad, which are separated by a gap. Typically, a solder bridge or a solder ball is positioned above an air gap, which is configured to sever the electrical connection through the solder bridge or the solder ball by a structural breakage or separation at a threshold fuse activation point (i.e. due to an increased wetting force), which is triggered at a specific temperature, a specific current level, and/or a specific voltage level experienced by the solder bridge or the solder ball.

In addition, for the purpose of describing the invention, a term described herein as "power surge" or "power surge event" is defined as a spike in voltage, current, or both. An example of a power surge is a voltage or current spike at an input terminal of an electrical device caused by an external power source, an external electrical signal, or a sudden change in environment such as lightening or ESD discharging.

One aspect of an embodiment of the present invention is providing a novel fuse device with electrically-conductive vias that vertically connect frontside and backside metal pads in the fuse device to enable direct and packageless mounting to a fuse-applied circuitry.

Another aspect of an embodiment of the present invention is providing a novel fuse device with a structural novelty that achieves a scalable and cost-effective miniaturization of the novel fuse device incorporated in an electronic device by circumventing the need for a conventional fuse packaging.

Moreover, another aspect of an embodiment of the present invention is providing a novel fuse device to reduce or eliminate parasitic resistance inherent in conventional package elements associated with a conventional fuse device.

Furthermore, another aspect of an embodiment of the present invention is providing one or more novel device fabrication steps and methods for manufacturing a novel vertically-connected packageless fuse device.

FIG. 1 shows a top view (100) of a vertically-connected packageless fuse device after the device is constructed, in accordance with an embodiment of the invention. As shown in this top view (100) of the device, the completed vertically-connected packageless fuse device comprises a first frontside metal pad (101) and a second frontside metal pad (105) separated by a gap (103), which may be an air gap or another electrically-insulating gap made of insulating materials. The first frontside metal pad (101) and the second frontside metal pad (105) are positioned on top of a base substrate (109), which is typically made of ceramic, silicon dioxide, glass, plastic, or another electrically-insulating material suitable for electronic device construction. The frontside metal pads (101, 105) can be made of nickel, gold-nickel alloy, PdAg, or another electrically-conductive substance that can provide a high electrical conductivity with low resistance, and at least in some cases, temperature-dependent wetting force to break a solder bridge (107) at a specified temperature to activate the fuse. Furthermore, the frontside metal pads (101, 105) preferably utilize materials (e.g. PdAg, nickel, gold-nickel alloy, etc.) that are easily solderable for seamless attachment to electrical terminals of a device circuit that requires fuse-based power protection.

Figure 3:
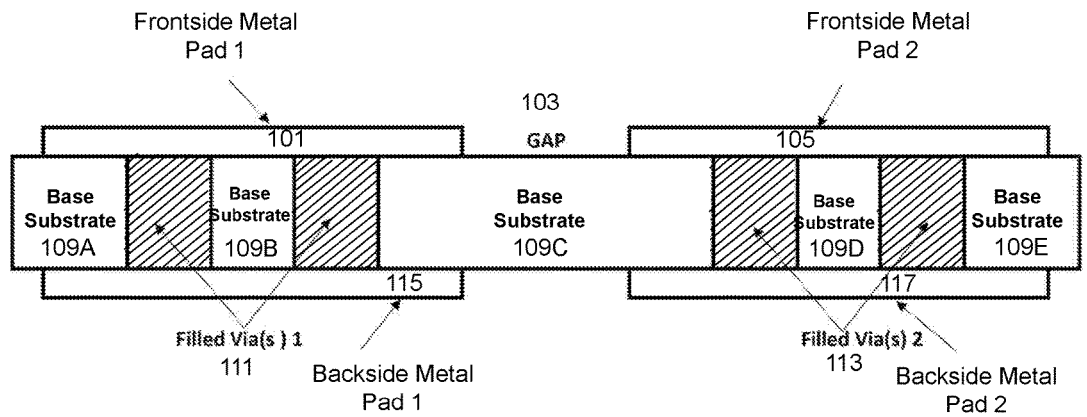
FIG. 3 shows a cross sectional view of a vertically-connected packageless fuse device during its construction phase, showing a base substrate filled with metal vias connecting a frontside metal pad to a backside metal pad through the base substrate, in accordance with an embodiment of the invention.
Figure 4:
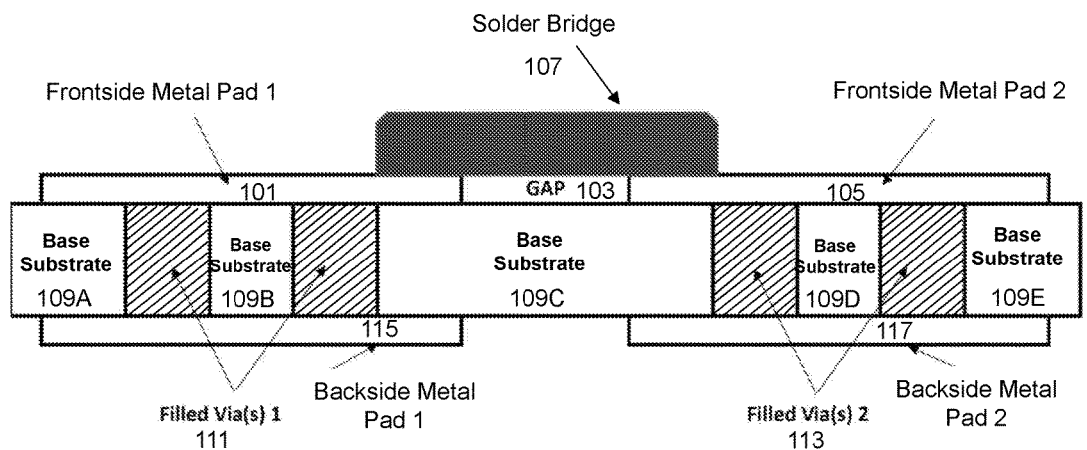
FIG. 4 shows a cross sectional view of a vertically-connected packageless fuse device as a completed product after construction, which shows a temperature-triggered solder bridge across a gap and a base substrate filled with metal vias connecting a frontside metal pad to a backside metal pad through the base substrate, in accordance with an embodiment of the invention.

Moreover, in a preferred embodiment of the invention as shown in FIG. 1, the solder bridge (107) is anchored and/or attached to the first frontside metal pad (101) and the second frontside metal pad (105) across the gap (103). In another embodiment of the invention, a solder ball or another temperature-triggered and breakable structure may be mounted on top of the frontside metal pads (101, 105) across the gap (103). Furthermore, as illustrated in FIGS. 2-4, the frontside metal pads (101, 105) are configured to be electrically and vertically connected to corresponding backside metal pads with metal-filled vias, which are vertically drilled through the base substrate (109).

In the preferred embodiment of the invention, each of the frontside metal pads (101, 105) may be 170 um long and 200 um wide, and the solder bridge (107) may be 160 um long and 150 um wide across the gap (103), which is 60 um long, as exemplary dimensions indicated in FIG. 1. Furthermore, the overall length of the frontside metal pads (101, 105) including the gap (103) spacing may be 400 um, and the base substrate (109) may have an outer margin of 25 um around borders of the frontside metal pads (101, 105), as exemplary dimensions indicated in FIG. 1. In another embodiment of the invention, other dimensions for fuse device components may be utilized, depending on fuse footprint miniaturization requirements and/or desired performance parameters for specific fuse applications.

Figure 2:
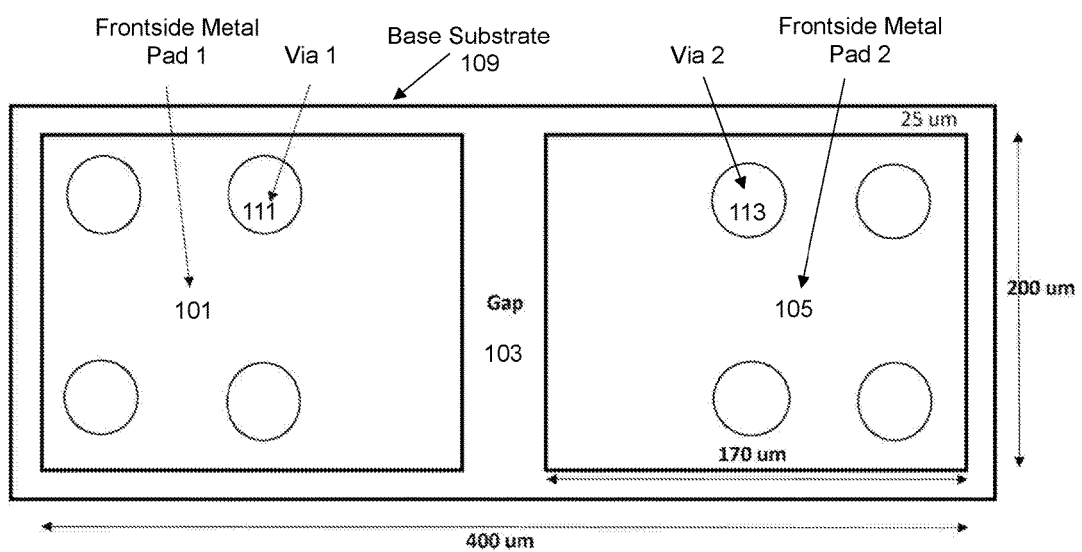
FIG. 2 shows a top view of a vertically-connected packageless fuse device during its construction phase, with one or more drilled vias that electrically connect a frontside metal pad to a backside metal pad through a base substrate in the vertically-connected packageless fuse device, in accordance with an embodiment of the invention.

FIG. 2 shows a top view (200) of a vertically-connected packageless fuse device during its construction phase, with one or more drilled vias (111, 113) that electrically and vertically connect the frontside metal pad (101 or 105) to the corresponding backside metal pad through the base substrate (109) in the vertically-connected packageless fuse device, in accordance with an embodiment of the invention. Each of the one or more drilled vias (111, 113) is filled with highly electrically-conductive material(s) with low resistance(s), and is specifically configured to contact a surface of the frontside metal pad and a surface of the corresponding backside metal pad to conduct electricity vertically through the base substrate (109), which is typically made of electrically-insulating material(s).

Depending on specific needs of current-carrying capacity and other fuse design considerations, one or more vias may be drilled on each side of the metal pads (i.e. 101 or 105). In general, a higher current-carrying design requirement may benefit from implementing more than one via per each metal pad to provide a plurality of vertically-oriented electrical current pathways, which in turn deter unintended thermal runaways and undesirable parasitic resistances within the vertically-connected packageless fuse device. Furthermore, it is also generally desirable to position the drilled vias (111, 113) as far away as possible from the gap (103) to minimize chances of such unintended thermal runaways, undesirable parasitic resistances, and premature device failures, which may occur if the drilled vias (111, 113) and the solder bridge (107) are dangerously positioned in overly close proximity. However, in some embodiments of the invention, the drilled vias (111, 113) may also be positioned underneath the solder bridge (107) to provide space savings and to optimize the footprint size of the vertically-connected packageless fuse device.

In the embodiment of the invention as shown in FIG. 2, each drilled via (e.g. 111 or 113) may have a diameter of 40 microns and a center-to-center via pitch of 70 microns, as exemplary dimensions. Furthermore, as an exemplary dimension, the base substrate (109) may have a thickness of 250 microns. In another embodiment of the invention, other dimensions for fuse device components may be utilized, depending on fuse footprint miniaturization requirements and/or desired performance parameters for specific fuse applications. It should be noted that all figures (i.e. FIGS. 1-7) presented herein that are associated with one or more embodiments of the invention are not necessarily drawn to scale for ease of illustrations and presentations. It is clear that one of ordinary skill in the art, based on the exemplary dimensions disclosed in at least some of the figures, can readily appreciate the approximate scales and the proportions of individual components that are preferred in some embodiments of the invention.

FIG. 3 shows a cross sectional view (300) of a vertically-connected packageless fuse device during its construction phase, showing a base substrate (109A, 109B, 109C, 109D, 109E) filled with electrically-conductive metallic vias (111, 113) that provide vertically-oriented electrical connections between a frontside metal pad (101 or 105) to a backside metal pad (115 or 117) through the base substrate, in accordance with an embodiment of the invention. In this embodiment, the base substrate is segmented into multiple pieces (i.e. 109A, 109B, 109C, 109D, 109E) after a multiple number of vias (i.e. 111, 113) are drilled vertically into the base substrate. The drilled vias are preferably filled with copper, palladium silver alloys (PdAg), or another metallic substances that are electrically conductive with low resistivity. Moreover, the backside metal pads (115, 117) preferably utilize PdAg, nickel, gold-nickel alloy, or other metallic substances that are easily solderable for seamless attachment to a printed circuit board (PCB) containing a device circuit that requires fuse-based power protection.

Furthermore, the base substrate is typically made of ceramic, silicon dioxide, glass, plastic, or another electrically-insulating materials to prevent unintended electrical short within the structure of the vertically-connected packageless fuse device. In one exemplary embodiment, the thickness of the base substrate may be 250 microns. The electrical current pathway in this embodiment of the invention is established when one terminal of a circuit requiring power protection is connected to the first frontside and backside metal pads (101, 115) and another terminal of the circuit is connected to the second frontside and backside metal pads (105, 117), while the solder bridge (107) remains unbroken and connected across the gap (103). The drilled and metal-filled vias (111, 113) enable each frontside metal pad (101 or 105) to be electrically and vertically connected to a corresponding backside metal pad (115 or 117) positioned straight below the base substrate (109A, 109B, 109C, 109D, 109E), as shown in FIG. 3.

FIG. 4 shows a cross sectional view (400) of a vertically-connected packageless fuse device as a completed product after construction, which shows the temperature-triggered solder bridge (107) across the gap (103) and the base substrate (109A, 109B, 109C, 109D, 109E) penetrated by the metal-filled vias (111, 113) that vertically and electrically connect the frontside metal pads (101, 105) to the corresponding backside metal pads (115, 117) through the base substrate, in accordance with an embodiment of the invention.

In one embodiment of the invention, a device fabrication process for the vertically-connected packageless fuse device generally involves the following seven steps:

1. Drilling vertically to create each intended via (e.g. 111, 113, etc.) through the base substrate (e.g. 109), which may be made of silicon dioxide, silicon, glass, ceramic, or another suitable material. After all intended vias are created, the base substrate may be segmented into several pieces (e.g. 109A, 109B, 109C, 109D, 109E), as illustrated in FIGS. 3-4.

2. Filling each via with an electrically-conductive material. Typically, vias utilized in this fuse device fabrication process are filled with copper (Cu), palladium-silver alloy (PdAg), or another electrically highly-conductive metallic substance(s).

3. Depositing a first frontside metal pad (e.g. 101) and a second frontside metal pad (e.g. 105) on top of the base substrate (e.g. 109A, 109B, 109C, 109D, 109E), which incorporated the metal-filled vias. Typically, these frontside metal pads are made of nickel, PdAg, or nickel-gold (Ni/Au) alloys, which are electrically highly conductive and easily solderable to attach to two terminals of an electronic device circuit requiring fuse-based power protection.

4. Patterning the frontside metal pad(s) with etching or screening to create or accommodate a gap (e.g. 103) between the first frontside metal pad (e.g. 101) and the second frontside metal pad (e.g. 105). The patterning process may also optimize the geometry of the frontside metal pad(s) for seamless and space-saving soldering configuration with the electronic device circuit terminals requiring fuse-based power protection.

5. Coating the frontside metal pad(s) with a protective coating to prevent solder from running out and accidentally covering the frontside metal pad(s). Then, constructing and mounting a solder bridge (e.g. 107) or a solder ball on top of the patterned frontside metal pads (e.g. 101, 105) across the gap (e.g. 103). This process may be performed in a solder ball house. Then, removing and cleaning the protective coating after the solder reflow process is completed.

6. Depositing backside metal pad(s) (e.g. 115, 117) underneath the base substrate (e.g. 109A, 109B, 109C, 109D, 109E). Typically, these backside metal pads are made of nickel, PdAg, or nickel-gold (Ni/Au) alloys, which are electrically highly conductive and easily solderable to attach the fuse device to a PCB containing the electronic device circuit terminals requiring fuse-based power protection.

7. Patterning the backside metal pad(s) with etching or screening to create, if necessary, a separation between the first backside metal pad (e.g. 115) and the second backside metal pad (e.g. 117). The patterning process may also optimize the geometry of the backside metal pad(s) for seamless and space-saving attachment to the PCB containing the electronic device circuit terminals requiring fuse-based power protection.

A key novel aspect of this fuse structure is that the backside metal pads (115, 117) can be directly mounted onto and connected to a printed circuit board (PCB) without a conventional leadframe or cavity fuse package that typically encapsulates a conventional fuse structure prior to mounting. The PCB contains an electronic circuitry requiring power protection, and the frontside metal pads (101, 105) are configured to connect to two terminals of the electronic circuitry requiring power protection. By incorporating metal-filled vias (111, 113) that vertically and electrically connect the frontside metal pads (101, 105) to the corresponding backside pads (115, 117) located straight below the base substrate segments (109A, 109B, 109C, 109D, 109E), the novel fuse structure, as disclosed in FIGS. 1-4, can be integrated into the electronic circuitry without dedicated packaging for the novel fuse device.

The elimination of the dedicated packaging for the novel fuse device enabled by metal-filled vias between frontside and backside metal pads, as disclosed in FIGS. 1-4, provides several advantages over conventionally-packaged fuses. One advantage of the vertically-connected packageless fuse device is enabling a scalable and cost-effective miniaturization of the fuse in a fuse-applied circuitry. As a packageless fuse device, the miniaturization of the fuse is made easier by removing spacing requirements related to wire bonding, cavity packaging, and/or leadframe packaging during integration of the fuse into the fuse-applied circuitry. Furthermore, the dimensions of the packageless fuse device can be more easily scaled up or down for seamless integration of the fuse into the fuse-applied circuitry, without facing a cumbersome need to adjust fuse package sizes, spacing, and connection requirements with the fuse-applied circuitry. Moreover, the direct mounting of the packageless fuse device reduces or eliminates parasitic resistance inherent in conventional package elements associated with a conventional fuse device (i.e. due to inherent resistivity present in wire bonding and various intermediary connectors and pads in the conventional package elements), which in turn leads to energy consumption efficiency and improved thermal management for the fuse-applied circuitry.

Figure 5:
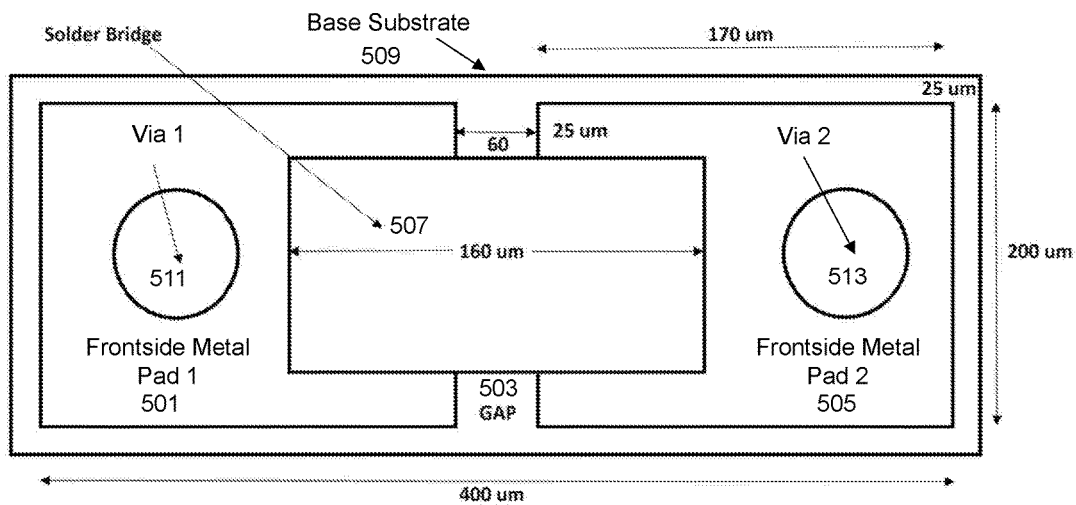
FIG. 5 shows a top view of a vertically-connected packageless fuse device after the device is constructed, with one or more drilled vias that electrically connect a frontside metal pad to a backside metal pad through a base substrate in the vertically-connected packageless fuse device, in accordance with an embodiment of the invention.

FIG. 5 shows a top view (500) of a vertically-connected packageless fuse device after the device is constructed, with one or more drilled vias (511, 513) that electrically connect a frontside metal pad (501 or 505) to a backside metal pad through a base substrate (509) in the vertically-connected packageless fuse device, in accordance with an embodiment of the invention. As shown in this top view (500) of the device, the completed vertically-connected packageless fuse device comprises a first frontside metal pad (501) and a second frontside metal pad (505) separated by a gap (503), which may be an air gap or another electrically-insulating gap made of insulating materials. The first frontside metal pad (501) and the second frontside metal pad (505) are positioned on top of the base substrate (509), which is typically made of ceramic, silicon dioxide, glass, plastic, or another electrically-insulating material suitable for electronic device construction. The frontside metal pads (501, 505) can be made of PdAg, nickel, gold-nickel alloy, or another electrically-conductive substance that can provide a high electrical conductivity with low resistance, and at least in some cases, temperature-dependent wetting force to break a solder bridge (507) at a specified temperature to activate the fuse. Furthermore, the frontside metal pads (501, 505) preferably utilize materials (e.g. PdAg, nickel, gold-nickel alloy, etc.) that are easily solderable for seamless attachment to electrical terminals of a device circuit that requires fuse-based power protection.

Figure 6:
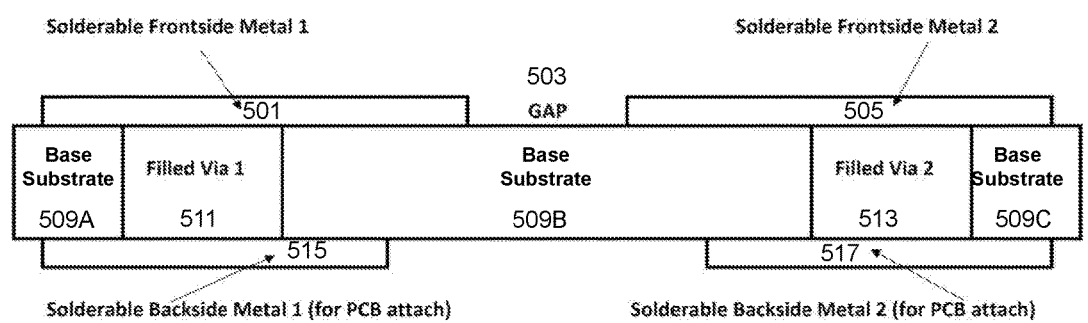
FIG. 6 shows a cross sectional view of a vertically-connected packageless fuse device during its construction phase, showing a base substrate filled with metal vias connecting a frontside metal pad to a backside metal pad through the base substrate, in accordance with an embodiment of the invention.
Figure 7:
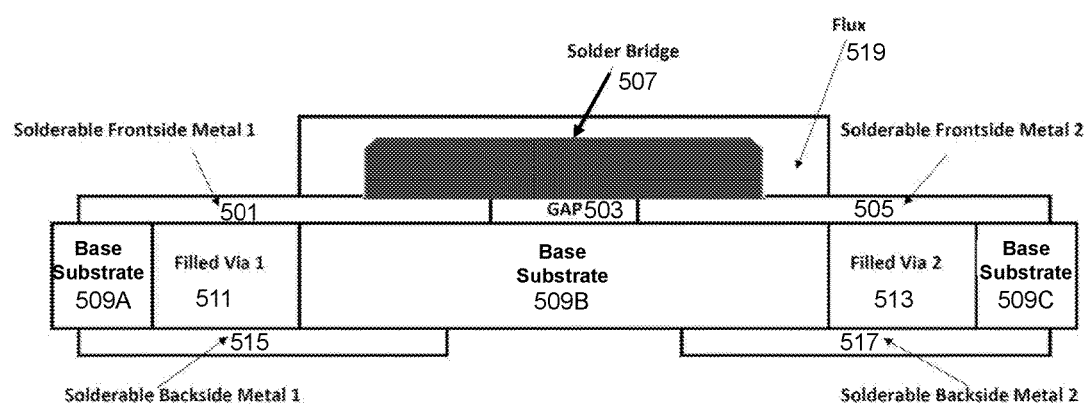
FIG. 7 shows a cross sectional view of a vertically-connected packageless fuse device as a completed product after construction, which shows a temperature-triggered solder bridge encapsulated by a flux material across a gap and a base substrate filled with metal vias connecting a frontside metal pad to a backside metal pad through the base substrate, in accordance with an embodiment of the invention.

Moreover, in a preferred embodiment of the invention as shown in FIG. 5, the solder bridge (507) is anchored and/or attached to the first frontside metal pad (501) and the second frontside metal pad (505) across the gap (503). In another embodiment of the invention, a solder ball or another temperature-triggered and breakable structure may be mounted on top of the frontside metal pads (501, 505) across the gap (503). Furthermore, as illustrated in FIGS. 5-7, the frontside metal pads (501, 505) are configured to be electrically and vertically connected to corresponding backside metal pads with metal-filled vias, which are vertically drilled through the base substrate (509).

In the preferred embodiment of the invention, each of the frontside metal pads (501, 505) may be 170 um long and 200 um wide, and the solder bridge (507) may be 160 um long and 150 um wide across the gap (503), which is 60 um long, as exemplary dimensions indicated in FIG. 5. Furthermore, the overall length of the frontside metal pads (501, 505) including the gap (503) spacing may be 400 um, and the base substrate (509) may have an outer margin of 25 um around borders of the frontside metal pads (501, 505), as exemplary dimensions indicated in FIG. 5. In another embodiment of the invention, other dimensions for fuse device components may be utilized, depending on fuse footprint miniaturization requirements and/or desired performance parameters for specific fuse applications.

In the embodiment of the invention as shown in FIG. 5, each of the one or more drilled vias (511, 513) is filled with electrically conductive material(s) with low resistance(s), and is specifically configured to contact a surface of the frontside metal pad and a surface of the corresponding backside metal pad to conduct electricity vertically through the base substrate (509), which is typically made of electrically-insulating material(s).

Depending on specific needs of current-carrying capacity and other fuse design considerations, one or more vias may be drilled on each side of the metal pads (i.e. 501 or 505). In general, a higher current-carrying design requirement may benefit from implementing more than one vias per each metal pad to provide a plurality of vertically-oriented electrical current pathways, which in turn deter unintended thermal runaways and undesirable parasitic resistances within the vertically-connected packageless fuse device. Furthermore, it is also highly desirable to position the drilled vias (511, 513) as far away as possible from the gap (503) to minimize chances of such unintended thermal runaways, undesirable parasitic resistances, and premature device failures, which may occur if the drilled vias (511, 513) and the solder bridge (507) are dangerously positioned in overly close proximity. However, in some embodiments of the invention, the drilled vias (511, 513) may also be positioned underneath the solder bridge (507) to provide space savings and to optimize the footprint size of the vertically-connected packageless fuse device.

Furthermore, in one embodiment, each drilled via (e.g. 511 or 513) may have a diameter of 40 microns and a center-to-center via pitch of 70 microns, as exemplary dimensions. Furthermore, as an exemplary dimension, the base substrate (509) may have a thickness of 250 microns. In another embodiment of the invention, other dimensions for fuse device components may be utilized, depending on fuse footprint miniaturization requirements and/or desired performance parameters for specific fuse applications. It should be noted that all figures (i.e. FIGS. 1-7) presented herein that are associated with one or more embodiments of the invention are not necessarily drawn to scale for ease of illustrations and presentations. It is clear that one of ordinary skill in the art, based on the exemplary dimensions disclosed in at least some of the figures, can readily appreciate the approximate scales and the proportions of individual components that are preferred in some embodiments of the invention.

FIG. 6 shows a cross sectional view (600) of a vertically-connected packageless fuse device during its construction phase, showing a base substrate (509A, 509B, 509C) filled with electrically-conductive metallic vias (511, 513) that provide vertically-oriented electrical connections between a frontside metal pad (501 or 505) to a backside metal pad (515 or 517) through the base substrate, in accordance with an embodiment of the invention. In this embodiment, the base substrate is segmented into multiple pieces (i.e. 509A, 509B, 509C) after a multiple number of vias (i.e. 511, 513) are drilled vertically into the base substrate. The drilled vias are preferably filled with copper, palladium silver alloys (PdAg), or another metallic substances that are electrically conductive with low resistivity. Moreover, the backside metal pads (515, 517) preferably utilize PdAg, nickel, gold-nickel alloy, or other metallic substances that are easily solderable for seamless attachment to a printed circuit board (PCB) containing a device circuit that requires fuse-based power protection.

Furthermore, the base substrate is typically made of ceramic, silicon dioxide, glass, plastic, or another electrically-insulating materials to prevent unintended electrical short within the structure of the vertically-connected packageless fuse device. In one exemplary embodiment, the thickness of the base substrate may be 250 microns. The electrical current pathway in this embodiment of the invention is established when one terminal of a circuit requiring power protection is connected to the first frontside and backside metal pads (501, 515) and another terminal of the circuit is connected to the second frontside and backside metal pads (505, 517), while the solder bridge (507) remains unbroken and connected across the gap (503). The drilled and metal-filled vias (511, 513) enable each frontside metal pad (501 or 505) to be electrically and vertically connected to a corresponding backside metal pad (515 or 517) positioned straight below the base substrate (509A, 509B, 509C), as shown in FIG. 6.

FIG. 7 shows a cross sectional view (700) of a vertically-connected packageless fuse device as a completed product after construction, which shows the temperature-triggered solder bridge (507) across the gap (503) and the base substrate (509A, 509B, 509C) penetrated by the metal-filled vias (511, 513) that vertically and electrically connect the frontside metal pads (501, 505) to the corresponding backside metal pads (515, 517) through the base substrate, in accordance with an embodiment of the invention.

In one embodiment of the invention, a device fabrication process for the vertically-connected packageless fuse device generally involves the following seven steps:

1. Drilling vertically to create each intended via (e.g. 511, 513, etc.) through the base substrate (e.g. 509), which may be made of silicon dioxide, silicon, glass, ceramic, or another suitable material. After all intended vias are created, the base substrate may be segmented into several pieces (e.g. 509A, 509B, 509C), as illustrated in FIGS. 6-7.
2. Filling each via with an electrically-conductive material. Typically, vias utilized in this fuse device fabrication process are filled with copper (Cu), palladium-silver alloy (PdAg), or another electrically highly-conductive metallic substance(s).
3. Depositing a first frontside metal pad (e.g. 501) and a second frontside metal pad (e.g. 505) on top of the base substrate (e.g. 509A, 509B, 509C), which incorporated the metal-filled vias. Typically, these frontside metal pads are made of nickel, PdAg, or nickel-gold (Ni/Au) alloys, which are electrically highly conductive and easily solderable to attach to two terminals of an electronic device circuit requiring fuse-based power protection.
4. Patterning the frontside metal pad(s) with etching or screening to create or accommodate a gap (e.g. 503) between the first frontside metal pad (e.g. 501) and the second frontside metal pad (e.g. 505). The patterning process may also optimize the geometry of the frontside metal pad(s) for seamless and space-saving soldering configuration with the electronic device circuit terminals requiring fuse-based power protection.
5. Coating the frontside metal pad(s) with a protective coating to prevent solder from running out and accidentally covering the frontside metal pad(s). Then, constructing and mounting a solder bridge (e.g. 507) or a solder ball on top of the patterned frontside metal pads (e.g. 501, 505) across the gap (e.g. 503). This process may be performed in a solder ball house. Then, removing and cleaning the protective coating after the solder reflow process is completed.
6. Depositing backside metal pad(s) (e.g. 515, 517) underneath the base substrate (e.g. 509A, 509B, 509C). Typically, these backside metal pads are made of nickel, PdAg, or nickel-gold (Ni/Au) alloys, which are electrically highly conductive and easily solderable to attach the fuse device to a PCB containing the electronic device circuit terminals requiring fuse-based power protection.
7. Patterning the backside metal pad(s) with etching or screening to create, if necessary, a separation between the first backside metal pad (e.g. 515) and the second backside metal pad (e.g. 517). The patterning process may also optimize the geometry of the backside metal pad(s) for seamless and space-saving attachment to the PCB containing the electronic device circuit terminals requiring fuse-based power protection.

A key novel aspect of this fuse structure is that the backside metal pads (515, 517) can be directly mounted onto and connected to a printed circuit board (PCB) without a conventional leadframe or cavity fuse package that typically encapsulates a conventional fuse structure prior to mounting. The PCB contains an electronic circuitry requiring power protection, and the frontside metal pads (501, 505) are configured to connect to two terminals of the electronic circuitry requiring power protection. By incorporating metal-filled vias (511, 513) that vertically and electrically connect the frontside metal pads (501, 505) to the corresponding backside pads (515, 517) located straight below the base substrate segments (509A, 509B, 509C), the novel fuse structure, as disclosed in FIGS. 5-7, can be integrated into the electronic circuitry without dedicated packaging for the novel fuse device.

The elimination of the dedicated packaging for the novel fuse device enabled by metal-filled vias between frontside and backside metal pads, as disclosed in FIGS. 5-7, provides several advantages over conventionally-packaged fuses. One advantage of the vertically-connected packageless fuse device is enabling a scalable and cost-effective miniaturization of the fuse in a fuse-applied circuitry. As a packageless fuse device, the miniaturization of the fuse is made easier by removing spacing requirements related to wire bonding, cavity packaging, and/or leadframe packaging during integration of the fuse into the fuse-applied circuitry.

Furthermore, the dimensions of the packageless fuse device can be more easily scaled up or down for seamless integration of the fuse into the fuse-applied circuitry, without facing a cumbersome need to adjust fuse package sizes, spacing, and connection requirements with the fuse-applied circuitry. Moreover, the direct mounting of the packageless fuse device reduces or eliminates parasitic resistance inherent in conventional package elements associated with a conventional fuse device (i.e. due to inherent resistivity present in wire bonding and various intermediary connectors and pads in the conventional package elements), which in turn leads to energy consumption efficiency and improved thermal management for the fuse-applied circuitry.

Moreover, the vertically-connected packageless fuse device disclosed in various embodiments of the present invention can be readily integrated into conventional IC designs, and various manufacturing steps disclosed herein for production of the vertically-connected packageless fuse device enables easy integration of this novel fuse design into many different types of IC's, discrete components, and other electronic devices.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A vertically-connected packageless fuse device comprising:
   an electrically-insulating base substrate;
   a first via and a second via vertically drilled into the electrically-insulating base substrate, wherein the first via and the second via are subsequently filled with an electrically-conductive substance;
   a first frontside metal pad located on top of the first via and at least a portion of the electrically-insulating base substrate;
   a second frontside metal pad located on top of the second via and at least a portion of the electrically-insulating base substrate;
   an electrically-insulating gap positioned between the first frontside metal pad and the second frontside metal pad;
   a solder bridge mounted over the electrically-insulating gap, wherein the solder bridge is attached to the first frontside metal pad and the second frontside metal pad to conduct electricity unless the solder bridge is broken at a prespecified fuse activation condition;
   a first backside metal pad located below the first via and at least a portion of the electrically-insulating base substrate, wherein the first backside metal pad is configured to directly and packagelessly mount onto a printed circuit board (PCB) containing an electronic circuit requiring power surge protection without encapsulation in a leadframe or cavity package, and wherein the first backside metal pad and the first frontside metal pad are vertically and electrically connected by the first via; and
   a second backside metal pad located below the second via and at least a portion of the electrically-insulating base substrate, wherein the second backside metal pad does not contact the first backside metal pad, and is configured to directly and packagelessly mount onto the PCB containing the electronic circuit requiring power surge protection without encapsulation in the leadframe or cavity package, and wherein the second backside metal pad and the second frontside metal pad are vertically and electrically connected by the second via.

2. The vertically-connected packageless fuse device of claim 1, further comprising a first electrical terminal of the electronic circuit requiring power surge protection connected to the first frontside metal pad.

3. The vertically-connected packageless fuse device of claim 1, further comprising a second electrical terminal of the electronic circuit requiring power surge protection connected to the second frontside metal pad.

4. The vertically-connected packageless fuse device of claim 1, further comprising a flux material encapsulating the solder bridge.

5. The vertically-connected packageless fuse device of claim 1, wherein the electrically-conductive substance filling the first via and the second via is copper (Cu), or palladium-silver alloy (PdAg).

6. The vertically-connected packageless fuse device of claim 1, wherein the first frontside metal pad, the second frontside metal pad, the first backside metal pad, and the second backside metal pad are made of nickel, PdAg, or nickel-gold (Ni/Au) alloys, which are electrically highly conductive and easily solderable to attach to electrical terminals and the PCB containing the electronic circuit requiring power surge protection.

7. The vertically-connected packageless fuse device of claim 1, wherein the electrically-insulating base substrate is made of ceramic, silicon dioxide, silicon, or plastic materials.

8. The vertically-connected packageless fuse device of claim 1, wherein the electrically-insulating gap positioned between the first frontside metal pad and the second frontside metal pad is an air gap.

9. The vertically-connected packageless fuse device of claim 1, wherein the first via and the second via are positioned closer to either edges of the electrically-insulating base substrate and as far away as possible from the electrically-insulating gap located near a midpoint of the vertically-connected packageless fuse device.

10. A vertically-connected packageless fuse device manufacturing method comprising the steps of:
drilling vertically to create a first via and a second via through a base substrate;
filling each of the first via and the second via with an electrically-conductive substance;
depositing a first frontside metal pad and a second frontside metal pad on top of the base substrate;
patterning the first frontside metal pad and the second frontside metal pad with etching or screening to create an electrically-insulating gap between the first frontside metal pad and the second frontside metal pad, and to optimize geometry of the first frontside metal pad and the second frontside metal pad for packageless and space-saving soldering configurations with electronic device circuit terminals requiring fuse-based power surge protection;
coating the first frontside metal pad and the second frontside metal pad with a protective coating to prevent solder from running out and accidentally covering the first frontside metal pad and the second frontside metal pad;
constructing and mounting a solder bridge on top of the first frontside metal pad and the second frontside metal pad across the electrically-insulating gap;
removing the protective coating after a solder reflow process to construct and mount the solder bridge is completed;
depositing a first backside metal pad and a second backside metal pad underneath the base substrate; and
patterning the first backside metal pad and the second backside metal pad with etching or screening to create a separation between the first backside metal pad and the second backside metal pad, and to optimize geometry of the first backside metal pad and the second backside metal pad for packageless and space-saving attachment to a printed circuit board (PCB) containing the electronic device circuit terminals requiring fuse-based power surge protection.

11. The vertically-connected packageless fuse device manufacturing method of claim 10, wherein the electrically-conductive substance filling the first via and the second via is copper (Cu), or palladium-silver alloy (PdAg).

12. The vertically-connected packageless fuse device manufacturing method of claim 10, wherein the first frontside metal pad, the second frontside metal pad, the first backside metal pad, and the second backside metal pad are made of nickel, PdAg, or nickel-gold (Ni/Au) alloys, which are electrically highly conductive and easily solderable to attach to the PCB or the electronic device circuit terminals requiring fuse-based power surge protection.

13. The vertically-connected packageless fuse device manufacturing method of claim 10, wherein the base substrate is made of ceramic, silicon dioxide, silicon, glass, or plastic materials.

14. The vertically-connected packageless fuse device manufacturing method of claim 10, wherein the electrically-insulating gap positioned between the first frontside metal pad and the second frontside metal pad is an air gap.

15. The vertically-connected packageless fuse device manufacturing method of claim 10, wherein the first via and the second via are positioned closer to either edges of the base substrate and as far away as possible from the electrically-insulating gap located near a midpoint of the vertically-connected packageless fuse device.

* * * * *